(12) United States Patent
Weitekamp

(10) Patent No.: US 9,048,431 B2
(45) Date of Patent: Jun. 2, 2015

(54) ELECTRONIC DEVICES EMPLOYING ALIGNED ORGANIC POLYMERS

(71) Applicant: California Institute of Technology, Pasadena, CA (US)

(72) Inventor: Raymond Weitekamp, Glendale, CA (US)

(73) Assignee: California Institute of Technology, Pasadena, CA (US)

( * ) Notice: Subject to any disclaimer, the term of this patent is extended or adjusted under 35 U.S.C. 154(b) by 8 days.

(21) Appl. No.: 13/888,856

(22) Filed: May 7, 2013

(65) Prior Publication Data

US 2013/0292658 A1 Nov. 7, 2013

Related U.S. Application Data

(60) Provisional application No. 61/643,786, filed on May 7, 2012, provisional application No. 61/678,484, filed on Aug. 1, 2012.

(51) Int. Cl.
*H01L 51/00* (2006.01)
*C08G 61/08* (2006.01)
*C08G 61/12* (2006.01)

(52) U.S. Cl.
CPC ........ *H01L 51/0043* (2013.01); *H01L 51/0068* (2013.01); *H01L 51/0086* (2013.01); *C08G 61/08* (2013.01); *C08G 61/126* (2013.01); *C08G 2261/126* (2013.01); *C08G 2261/3223* (2013.01); *C08G 2261/3321* (2013.01); *C08G 2261/418* (2013.01); *C08G 2261/74* (2013.01); *C08G 2261/91* (2013.01)

(58) Field of Classification Search
USPC ............................................................ 257/40
See application file for complete search history.

(56) References Cited

U.S. PATENT DOCUMENTS

| | | | | |
|---|---|---|---|---|
| 6,420,648 | B1 * | 7/2002 | Lindsey | 136/263 |
| 7,067,349 | B1 * | 6/2006 | Buynoski et al. | 438/99 |
| 7,232,750 | B1 * | 6/2007 | Kingsborough | 438/623 |
| 8,741,585 | B2 * | 6/2014 | O'Connor et al. | 435/7.21 |
| 2012/0232238 | A1 * | 9/2012 | Katz et al. | 528/8 |
| 2014/0002957 | A1 * | 1/2014 | Casasanta, III | 361/502 |

* cited by examiner

*Primary Examiner* — Thao P Le
(74) *Attorney, Agent, or Firm* — Joseph R. Baker, Jr.; Gavrilovich, Dodd & Lindsey LLP

(57) ABSTRACT

The devices can be fabricated by a method that permits active polymer chains to be polymerized on the surface of an electrode such that the active polymer chains are aligned with one another. The active polymer chains can also be covalently linked to a second electrode so the active polymer chains are located in an active layer of the device. The polymerization method can be paused and resumed at any point in the polymerization so nanoparticles can be added into the active layer. Additionally, the polymerization method allows that active polymer chains to be polymerized so they include junctions such as p-n junctions and Schottky junctions.

10 Claims, 3 Drawing Sheets

ELECTRONIC DEVICES EMPLOYING ALIGNED ORGANIC POLYMERS

CROSS REFERENCE TO RELATED APPLICATIONS

This application claims the benefit of U.S. Provisional Patent Application Ser. Nos. 61/643,786, filed on May 7, 2012, and 61/678,484, filed on Aug. 1, 2012, the disclosure of which are incorporated herein in their entireties.

FIELD OF THE INVENTION

The invention relates to organic semiconductors, and more particularly, to electronic devices that employ organic semiconductors.

BACKGROUND

Organic semiconductors can be used to fabricate a variety of electronic devices. These devices can often generate electricity from incident light as occurs in photovoltaic devices such as solar cells. These devices often include one or more layers of material that include one or more organic semiconductor(s). The efficiency of these devices can often be increased by increasing the charge carrier mobility within these layers. However, the organic semiconductors that are currently used in these devices are generally highly disorganized. This disorganization requires that charge carriers jump from one strand of the organic semiconductor to another strand in order to travel though the layer of material. As a result, this disorganization is a source of inefficiency in these devices. There is a need for an increased efficiency in devices that employ organic semiconductors.

SUMMARY

An embodiment of the electronics device includes a first electrode and a second electrode. The device also includes organic polymer chains that are each covalently linked to both the first electrode and the second electrode.

Another embodiment of the electronics device includes block copolymer chains that are aligned with one another and that are fabricated on a surface of an electrode. The block copolymer chains each include a first block of a first organic polymer. The block copolymer chains also include a second block of a second organic polymer. In some instances, the first organic polymer is a semiconducting polymer acts as an electron acceptor and the second organic polymer is a semiconducting polymer acts as an electron donor. The block copolymer can be a diblock copolymer or can include more the two blocks. A p-n junction can be formed at an interface between the first block and the second block.

In some instances, the device includes nanoparticles positioned such that the block copolymer chains extend through interstices between the nanoparticles. In some instances, a p-n junction is formed at the interface of the first block and the second block and the nanoparticles are positioned such that the p-n junction is positioned in the interstices between the nanoparticles.

In some instances, the device is a solar cell.

A method of forming the device includes polymerizing a polymer on an electrode so as to form chains of the polymer on the electrode. The method also includes pausing the polymerization after the polymerization has been started. The method further includes applying a layer of nanoparticles to the portion of the polymer chains that were formed before the polymerization was paused. The method additionally includes resuming the polymerization of the polymer after applying the nanoparticles. In some instances, the polymerization is resumed such that the polymer chains extend through interstices between the nanoparticles.

Another embodiment of the method includes fabricating block copolymer chains on the surface of the electrode. Fabricating the block copolymer chains on the electrode can include polymerizing the block copolymer chains on the electrode. Polymerizing the block copolymer chains can include performing a ring-opening polymerization such as a Ring-Opening Metathesis Polymerization. In one example, the block copolymer chains are polymerized by a Surface Initiated Ring-Opening Metathesis Polymerization.

DESCRIPTION

Figure 1:
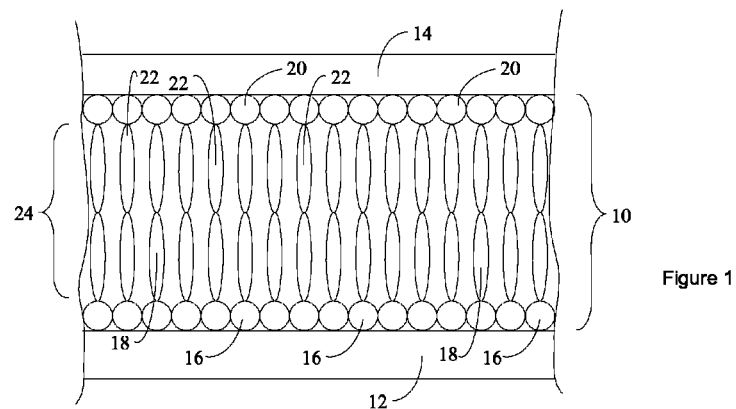
FIG. 1 is a cross section of an electronics device that employs organics polymers in an active layer of the device.

As used herein and in the appended claims, the singular forms "a," "and," and "the" include plural referents unless the context clearly dictates otherwise. Thus, for example, reference to "a pillar" includes a plurality of such pillars and reference to "the catalyst" includes reference to one or more catalysts known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

By "about" is meant a quantity, level, value, number, frequency, percentage, dimension, size, amount, weight or length that varies by as much as 30, 25, 20, 15, 10, 9, 8, 7, 6, 5, 4, 3, 2 or 1% to a reference quantity, level, value, number, frequency, percentage, dimension, size, amount, weight or length. With respect to ranges of values, the disclosure encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

A method of fabricating electronics devices such as solar cells is disclosed. The method permits active polymer chains to be polymerized on the surface of an electrode such that the active polymer chains are aligned with one another. The active polymer chains can include a block copolymer where a first block of the copolymer acts as an electron acceptor and a second block of the copolymer acts as an electron donor.

Since the active polymer chains are aligned with one another, the opposing ends of the active polymer chains can be concurrently attached to two electrodes. As a result, an electron traveling along an active polymer chain can reach either electrode without the need for chain hopping. The elimination of the need for chain hopping provides for a more efficient device. When the active polymer includes a block copolymer, the first block can be covalently bonded directly to the second block so a p-n junction can be formed at the interface between the first block and the second block. The covalent bonding between the first and second blocks allows efficient transfer of electrons between these domains.

A possible method of fabricating the device includes polymerizing the active polymer chains on an electrode that will become part of the device. The polymerization can be paused at nearly any point in the reaction and then resumed. A layer of nanoparticles can optionally be formed on the partially formed active polymer chains while the polymerization is paused. When the polymerization is resumed, the active polymer chains can extend through interstices in the nanoparticles. The ability to pause the polymerization at nearly any point in the polymerization allows one or more layers of the nanoparticles to be positioned anywhere along the length of the active polymer chains. For instance, a layer of the nanoparticles can be positioned such that the p-n junctions are positioned in the interstices of the nanoparticles. Additionally, the nanoparticles can be selected to scatter incident light. When the nanoparticles are positioned to scatter this light near the p-n junctions, the amount of light absorbed near the p-n junctions can be increased in order to further enhance the efficiency of the device. In addition to scattering light or as an alternative to scattering light, the nanoparticles can increase optical density near the nanoparticles as a result of the nanoparticles behaving as an antenna. When the nanoparticles are positioned to enhance light density near the p-n junctions, the amount of light absorbed near the p-n junctions can be increased in order to further enhance the efficiency of the device.

FIG. 1 is a cross section of an electronics device that employs organic polymers. The device includes an active layer 10 between a first electrode 12 and a second electrode 14. The active layer 10 includes a first anchoring group 16 that attaches a first organic polymer 18 to the first electrode 12. The active layer 10 also includes a second anchoring group 20 that attaches a second organic polymer 22 to the second electrode 14. In some instances, the first anchoring group 16 is covalently bonded to both the first electrode 12 and to the first organic polymer 18 and/or the second anchoring group 20 is covalently bonded to both the second electrode 14 and to the second organic polymer 22. In some instances, the first anchoring group includes covalent bonds arranged such that the first organic polymer 18 is covalently linked to the first electrode and/or the second anchoring group includes covalent bonds arranged such that the second organic polymer 22 is covalently linked to the second electrode. For instance, a pathway from the first electrode to the first organic polymer 18 can extend through the first anchoring group along only covalent bonds and/or a pathway from the second electrode to the second organic polymer can extend through the second anchoring group along only covalent bonds.

The first organic polymer 18 is bonded directly to the second organic polymer 22. The first organic polymer 18 can be covalently bonded directly to the second organic polymer 22. When the first organic polymer 18 and the second organic polymer 22 are covalently bonded to one another, the active polymer 24 can be a block copolymer. For instance, the first organic polymer 18 can be a first block of a block copolymer that includes two or more blocks and the second organic polymer 22 can be a second block of the block copolymer.

The first electrode 12 and/or the second electrode 14 are electrically conducting substrates and can be single layer or can include multiple layers of material. Suitable materials for a layer of the electrodes includes, but is not limited to, metals such as aluminum, silver, and copper. In some instances, one or more of the electrodes includes a layer of a metal oxide on the surface of the metal. One or both of the electrodes can be transparent or substantially transparent to light having wavelengths relevant to photovoltaics and photodiodes, approximately 200-2000 nm in freespace. An example of an optically transparent material that is suitable for use as a layer of an electrode includes, but is not limited to, fluorine tin oxide (FTO) or fluorine doped tin oxide or indium doped tin oxide.

The first anchoring group 16 and/or the second anchoring group 20 can be a typical anchoring groups used to attach a polymer to a surface such as phosphonates, carboxylates, silanes, thiols, nitrites, carbenes, isocyanates, amines, or catechols. The first anchoring group 16 and/or the second anchoring group 20 can be optional. For instance, the first organic polymer 18 can be attached directly to the first electrode 12 and/or the second organic polymer 22 can be attached directly to the second electrode 14 using techniques such as hydrosilylation, hydrolysis, or metathesis.

Suitable first organic polymers 18 include polymers that are electron acceptors and/or semiconducting organometallic polymers that are electron acceptors. These types of polymers can be p-type semiconductors and/or can be doped to behave as p-type semiconductors. Suitable second organic polymers 22 include polymers and/or semiconducting organometallic polymers that are electron donors or emitters. These types of polymers can be n-type semiconductors and/or can be doped to behave as an n-type semiconductor. Organic polymers that are suitable for use as the first organic polymers 18 and/or the second organic polymers 22 are polymers that exhibit semiconductor properties and that have a backbone where the monomers include or consist of carbon. Examples of polymers that can serve as the first organic polymer 18 and/or second organic polymer 22 include, but are not limited to, polyacetylenes, polypyrroles, polyanilines, poly(thienylenevinylene)s, polythiophenes, and poly(phenylenevinylenes), any of which can be substituted or unsubstituted and/or branched or unbranched. An example of a polymer that can be doped includes, but is not limited to, polyacetylenes. Organometallic semiconductor polymers are polymers that exhibit semiconducting properties and include carbon, hydrogen, and a metallic coordination complex that can be located in the backbone and/or sidechains. The metal from the coordination complexes can interrupt the connectivity of the organic backbone. Examples of organometallic semiconductor polymers that can serve as the first organic polymer 18 and/or second organic polymer 22 include, but are not limited to, platinum bridged organometallic polymers.

Figure 2:
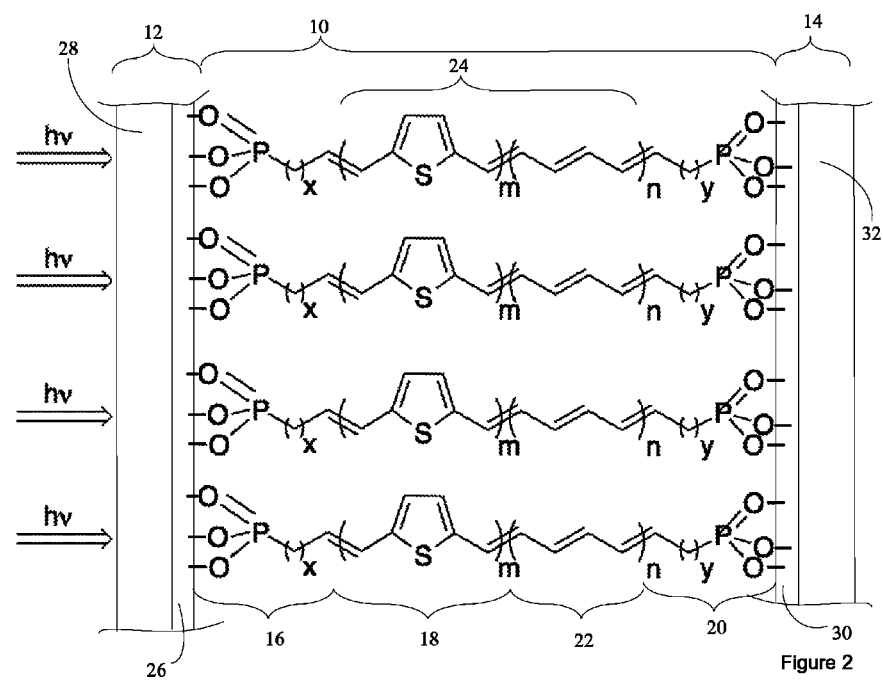
FIG. 2 provides an example of a portion of a device constructed according to FIG. 1.

FIG. 2 provides an example of a portion of a device constructed according to FIG. 1. The illustrated device is a photovoltaic device such as a solar cell. The first electrode 12 is transparent to incoming light. For instance, a layer of FTO 26 can serve as the first electrode 12. The layer of FTO transmits the incoming light and is electrically conductive. As is evident from FIG. 2, the electrode can be deposited on a transparent substrate 28 such as a SiO$_2$ substrate. The second electrode 14 need not be transparent to the light and can optionally be constructed to reflect incident light back into the active layer 10. The second electrode 14 includes a layer of aluminum oxide 30 on a layer of aluminum 32.

The first anchoring groups and the second anchoring groups 20 shown in FIG. 2 result from covalently bonding a phosphonic acid directly to the first electrode 12 and the second electrode 14. A suitable phosphonic acid for acting as a precursor to the illustrated anchoring groups includes, but is not limited to, $CH_2CH(CH_2)_xPO(OH)_2$. In FIG. 2, the variable x or y is greater than or equal to 1 and/or less than 20. In one example, x is 1 and y is 1.

The active polymer 24 is a block copolymer that includes two blocks. One of the blocks includes polyacetylene and the other block includes poly(thienylenevinylene). The polyacetylene serves as an electron acceptor and the poly(thienylenevinylene) serves as an electron donor. In FIG. 2, the variable n can be greater than or equal to 5 and/or less than or equal to 10,000 and the variable m can be greater than or equal to 5 and/or less than or equal to 10,000. The polyacetylene is covalently bonded directly to the poly(thienylenevinylene) to effectively provide a p-n junction at the interface of the first organic polymer 18 and the second organic polymer 22.

As evident from FIG. 2, a pathway from the first electrode to the first organic polymer 18 extends through the first anchoring group 16 along only covalent bonds and a pathway from the second electrode to the second organic polymer extends through the second anchoring group 20 along only covalent bonds. Accordingly, the first organic polymer 18 is covalently linked to the first electrode and the second organic polymer 22 is covalently linked to the second electrode.

Figure 3:
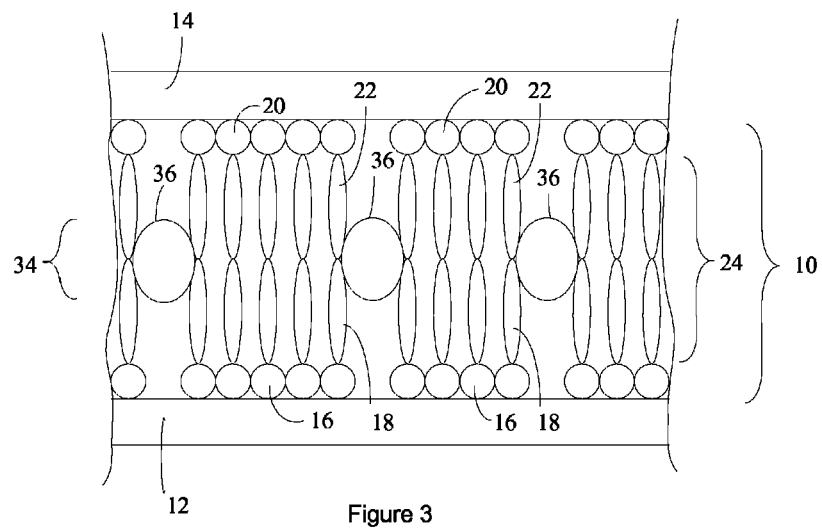
FIG. 3 is a cross section of an electronics device constructed according to FIG. 1 but with nanoparticles introduced into the active layer of the device.

As illustrated in FIG. 3, a layer 34 of nanoparticles 36 can be introduced into the active layer 10. Examples of suitable nanoparticles 36 include, but are not limited to, nanoparticles 36 that scatter incident light. Scattering of incident light can increase light absorption by the semiconductors. The increased absorption of light in the semiconductor can increase the efficiency of the certain devices such as solar cells. Further, the nanoparticles 36 can be locally placed at one or more locations within the active layer 10 that further increase the efficiency of the device. For instance, the nanoparticles 36 can be placed at or near the interface between the first organic polymer 18 and the second organic polymer 22. As a result, the nanoparticles 36 can be placed at or near the p-n junction that is present at this interface in order to increase carrier generation near the p-n junction, which is highly desirable for the purposes of efficiency.

In some instances, the nanoparticles 36 are not bonded to the active polymer 24. For instance, there are not covalent bonds between the nanoparticles 36 and the active polymer 24. Alternatively, functional groups could be added to the polymer and/or nanoparticles to create covalent bonds between the nanoparticles and the polymer. Examples of suitable nanoparticles 36 include, but are not limited to, metals or metal oxides such as metals that include or consist of one or more components selected from the group consisting of titania, silver, gold, aluminum, alumina, and silica. Suitable diameters for the nanoparticles 36 include, but are not limited to, diameters greater than 5 nm, 10 nm or 100 nm and/or less than 1000 nm.

Figure 4:
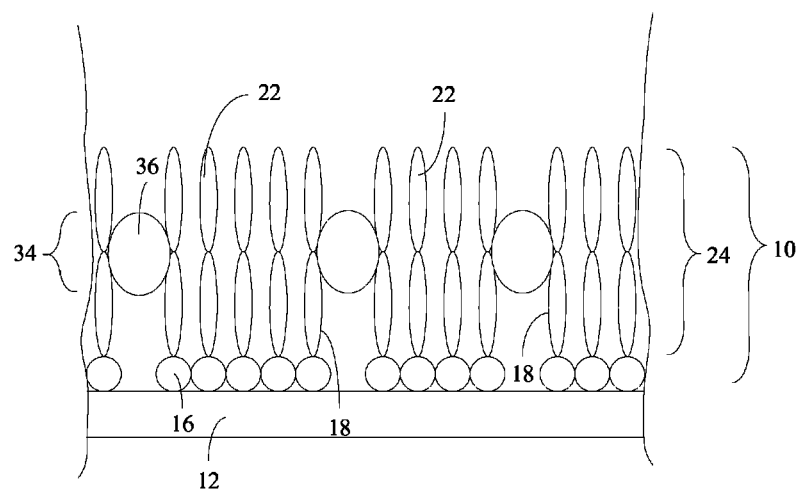
FIG. 4 illustrates an active layer that is formed on an electrode and is suitable for incorporation into other devices.

The device of FIG. 1 and FIG. 3 is disclosed in the context of a photovoltaic device such as a solar cell. However, the illustrated arrangement can be applied to other devices. Examples of other devices that can employ the disclosed arrangement include diodes, capacitors, light-emitting diodes (LEDs), transistors, photodetectors, chemical sensors, and thermoelectrics. Further, these devices can also be constructed using only a portion of the illustrated arrangement. For instances, these devices can incorporate the device disclosed in the context of FIG. 1 through FIG. 3 but with the disclosed device excluding the second electrode 14 or excluding both the second electrode 14 and second anchoring group 20 as illustrated in FIG. 4. Alternately, these devices can incorporate the device disclosed in the context of FIG. 1 through FIG. 3 but with the disclosed device excluding the first electrode 12 or excluding both the first electrode 12 and first anchoring group 16. Although FIG. 4 illustrates the active layer 10 including nanoparticles 36, the active layer 10 can exclude the nanoparticles 36.

In the device illustrated in FIG. 1 through FIG. 4, the active polymer chains 24 are aligned with one another. For instance, the active polymer chains 24 each extends away from the first electrode 12 and/or the second electrode 14 in the same direction. An end-to-end vector can provide a measure of this alignment. An end-to-end vector can be illustrated as an imaginary line drawn between the terminal carbons in the backbone of the active polymer chains 24 can provide a measure of this alignment. Alignment is achieved when these lines are parallel or substantially parallel to one another. For instance, each line can have an angle relative to the first electrode ($\theta_1$) or relative to the second electrode ($\theta_2$). Accordingly, the collection of lines can have an average angle between each line and the first electrode ($\theta_{1,avg}$) or the second electrode ($\theta_{2,avg}$). The active polymer chains 24 can be aligned such that more than 50%, 75%, or even 90% of the active polymer chains 24 have an angle relative to the first electrode ($\theta_1$) that is within the angle ($\theta_{1,avg}$)+/−30°, 15°, or 5°. Additionally or alternately, the active polymer chains 24 can be aligned such that more than 50%, 75%, or even 90% of the active polymer chains 24 have an angle relative to the second electrode ($\theta_2$) that is within the angle ($\theta_{2,avg}$)+/−30°, 15°, or 5°. In some instances, the active polymer chains 24 are fabricated such that the end-to-end vectors are perpendicular or substantially perpendicular to the first electrode or the second electrode. In these instances, the value of ($\theta_{1,avg}$) and/or ($\theta_{2,avg}$) can be 90°.

The first organic polymer and the second organic polymer are disclosed above as being semiconductors and as providing a p-n junction, however, the electronic device can have other constructions. As an example, the first organic polymer and/or the second organic polymer can be selected to provide a Schottky junction. This Schottky junction can be formed either between the two blocks of a diblock copolymer, or at the polymer/electrode interface. For instance, the first organic polymer or the second organic polymer can be a semiconductor as disclosed above and the other organic polymer can be an organic polymer that is doped to be metallic or semi-metallic in that there is no band-gap or a very small band-gap which leads to higher electrical conductivity. Alternately, the first organic polymer and the second organic polymer can be the same semiconducting polymer but one of them can be doped so as to be metallic or semi-metallic. Additionally, the first and second organic polymer may be different polymers of the same type (for example, both p-type), with the rectifying junction being a polymer/electrode Schottky contact. An example of an organic polymer can be doped so as to become metallic is polyacetylene. An example of a device according to the disclosure having one or more Schottky junction is a Schottky solar cell, or a metal-insulator-semiconductor (MIS) Schottky cell.

Figure 5:
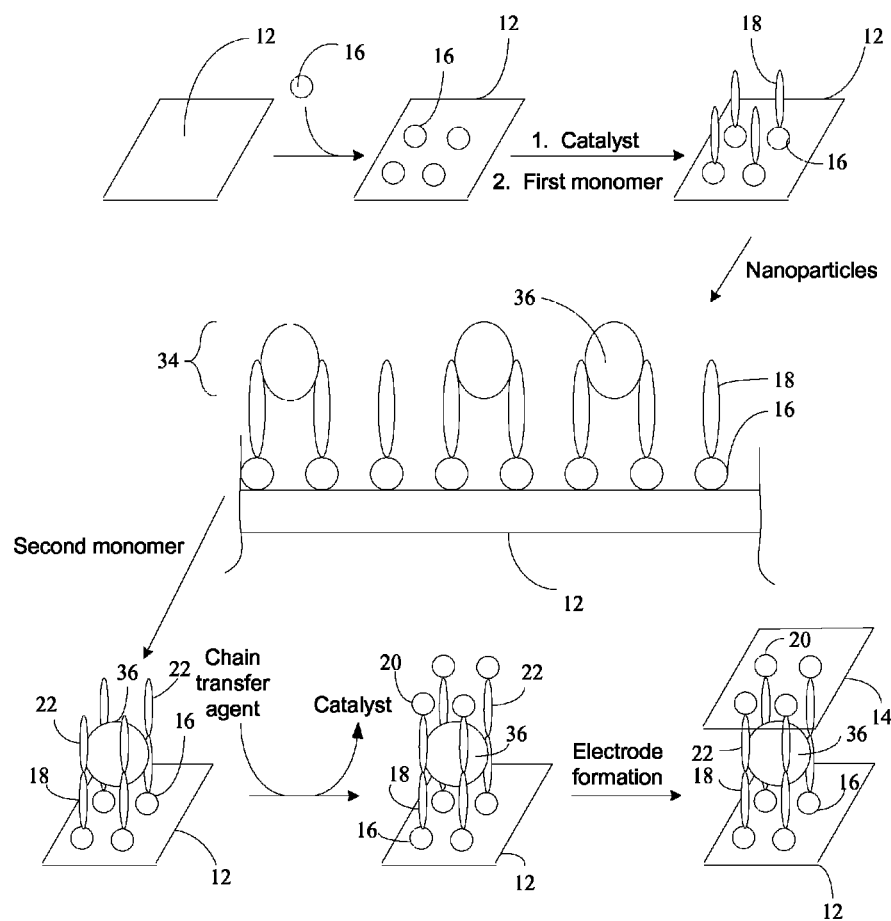
FIG. 5 illustrates a method of fabricating the device of FIG. 1 through FIG. 4.

FIG. 5 illustrates a method of fabricating the device of FIG. 1 through FIG. 4. A surface of a first electrode 12 is modified such that the first anchor group is bonded to the first anchoring group 16. The first anchor group can be arranged on the first electrode 12 in a self-assembled monolayer. In FIG. 5, the first anchor groups are not illustrated in a self-assembled monolayer in order to reduce the drawing complexity. Methods of forming a self-assembled monolayer on the electrode surface can be employed to bond the first anchoring group 16 to the electrode. When the surface to be modified is a metal or a metal oxide, a suitable method for bonding the first anchoring group 16 to the first electrode 12 includes, but is not limited to, Tethering By Aggregation and Growth (T-BAG). When a phosphonic acid is used as a precursor for the anchoring group, the Tethering by Aggregate Growth method produces a dense self-assembled monolayer of anchoring groups that are covalently bonded to the electrode by phosphonate oxide bonds such as the bonds shown in FIG. 2. Forming these layers includes the self-assembly monolayer replacing oxygen and hydroxyl groups present on the surface of the metal or metal oxide. The removal of hydroxyl groups from the surface can be beneficial because the hydroxyl groups can create electronic trap states at an oxidized metal interface.

The first organic polymer 18 is formed on the first anchoring groups 16. For instance, a first organic polymer 18 can be polymerized on the first anchoring groups 16. A suitable mechanism for polymerizing the first organic polymer 18 is a ring-opening polymerization (ROMP) such as Ring-Opening Metathesis Polymerization. In one example, the first organic polymer 18 is formed on the anchoring groups using Surface Initiated Ring-Opening Metathesis Polymerization. The polyacetylene and poly(thienylenevinylene) illustrated in FIG. 2 can both be generated using Surface Initiated Ring-Opening Metathesis Polymerization. Additionally, a copolymer including polyacetylene and poly(thienylenevinylene) arranged as illustrated in FIG. 2 can be generated using Surface Initiated Ring-Opening Metathesis Polymerization.

In a Ring-Opening Metathesis Polymerization, a driving force for the reaction is the release of ring strain in cyclic olefins. The Ring-Opening Metathesis Polymerization can be catalyzed through the formation of metal-carbene complexes ($M=CR_2$ or $M=CRH$ where M represents a metal and R represents an organic moiety). The metal-carbene complex can attack the double bond in the ring structure to form a metallacyclobutane intermediate. The breakdown of this metallacyclobutane favored the ring-opened product, which relieves the strain of the cyclic olefin and provides a linear chain that contains the metal carbene catalyst as the 'living end.' The carbene reacts with a carbon-carbon double bond on the next monomer to propagate the polymerization.

In a Surface Initiated Ring-Opening Metathesis Polymerization, the first anchoring groups 16 are modified to include the catalyst complex. For instance, the first anchoring group 16 can include a carbon-carbon double bond and, more particularly, a terminal carbon-carbon double bond. The first anchoring groups 16 are exposed to the catalyst, which can form an anchoring metal-carbene complex with the first anchoring group 16. As described above, the monomer is introduced to initiate the polymerization of a linear chain with the catalyst at the terminus. As a result, the growing polymer chain terminates at a double bonded between a carbon and a metal center of the catalyst. Accordingly, the catalyst remains at the terminal end of the growing polymer chain and the growth occurs by adding additional monomer to the terminal end of the polymer chain.

Suitable monomers for ring-opening polymerizations include, but are not limited to, alicyclic compounds. Suitable monomers for Ring-Opening Metathesis Polymerization include, but are not limited to, cyclic olefins. Suitable catalysts for ring-opening polymerizations and/or Ring-Opening Metathesis Polymerizations include, but are not limited to, Grubb's catalyst (1,3-Bis(2,4,6-trimethylphenyl)-2-imidazolidinylidene)dichloro(phenylmethylene) (tricyclohexylphosphine)ruthenium), ($C_{46}H_{65}Cl_2N_2PRu$), and Ruthenium, [1,3-bis-(2,4,6-trimethylphenyl)-2-imidazolidinylidene]dichloro (phenylmethylene)(tricyclohexylphosphine).

The polymerization can be paused by reducing the amount of available monomer, eliminating free monomer, or transferring the polymerization to a new environment. When it is desirable for the active layer 10 to include the nanoparticles 36, the nanoparticles 36 can be added after the polymerization of the first organic polymer 18 is stopped. The nanoparticles 36 can be added on top of the previously formed first organic polymer 18. For instance, the size of the nanoparticles 36 can be larger than the spacing between the terminal ends of the first organic polymer 18 chains in order to reduce substantial penetration of the nanoparticles 36 into the spaces between adjacent chains of the first organic polymer 18. Suitable methods for adding the nanoparticles 36 on top of the first organic polymer 18 includes, but is not limited to, transfer printing, spin-casting or drop-casting.

After the placement of the nanoparticles 36, the polymerization reaction can be resumed with the resulting polymer chains extending through the interstices between adjacent nanoparticles 36. For instance, polymerization techniques including Ring-Opening Metathesis Polymerization and Surface Initiated Ring-Opening Metathesis Polymerization can be resumed by reintroducing monomers to the previously formed polymer chains. The newly introduced monomers can be the same monomers as were previously used to form the first organic polymer 18. In the method shown in FIG. 5, the newly introduced monomers are second monomers for polymerizing the second organic polymer 22. When Surface Initiated Ring-Opening Metathesis Polymerization is employed to polymerize the first organic polymer 18, the second monomers are also selected to polymerize by a Ring-Opening Metathesis Polymerization mechanism that uses the same catalyst as was used to polymerize the first organic polymer 18. As a result, the polymerization resumes upon the exposure of the previously formed polymer chains to the second monomers but the resumed polymerization forms the second polymer.

The polymerization of the second polymer can be stopped by exposing the polymer chains to a chain transfer agent. Chain transfer agents transfer the catalyst from a growing polymer chain to the chain transfer agent. Since the polymerization during a Surface Initiated Ring-Opening Metathesis Polymerization occurs at the terminal end of the polymer chains, the use of a chain transfer agent results in all or a portion of the chain transfer agent being bonded to the end to the polymer chains. This enables one to functionalize the growing surface of the polymeric material. As a result, the chain transfer agent can be selected to include or consist of a precursor for the second anchoring agent that becomes bonded to the terminal end of the polymer chains. In some instances, the chain transfer agent can also be selected such that the catalyst or the metal from the catalyst is released from the polymer chains. As a result, expensive catalysts such as ruthenium can be recovered for later use.

In one example, the polymerization is stopped with a diphosphonic acid chain transfer agent such the diphosphonic acid represented by $(OH)_2OP(CH_2)_xCH=CH(CH_2)_xPO(OH)_2$ where x is greater than or equal to 1 and/or less than or equal to 20. This diphosphonic acid can replace a double bond between a carbon and catalyst at the terminal end of the polymer chain with a double bond between the carbon and a second anchoring group 20 precursor represented by $=CH(CH_2)_xPO(OH)_2$ where x is greater than or equal to 1 and/or less than or equal to 20. Additionally, the chain transfer reaction produces $M=CH(CH_2)_xPO(OH)_2$ where M represents the catalyst or the metal included in the catalyst. The $M=CH(CH_2)_xPO(OH)_2$ can be used as catalyst in a subsequent polymerization or can be further processed to recover the M in a form that is suitable for use as a catalyst in a subsequent polymerization. Other examples of suitable chain transfer agents include, but are not limited to, symmetrical internal olefins or vinyl ethers.

The surface that results from forming the precursor for the second anchoring group 20 can be metallized to form the second electrode 14. The metallization is performed such that the precursor for the second anchoring group 20 is converted to the second anchoring group 20. For instance, when the surface of the second electrode 14 includes aluminum or aluminum oxide, the second anchoring group 20 precursor represented by $=CH(CH_2)_xPO(OH)_2$ becomes covalently bonded to the second electrode 14 as illustrated in FIG. 2. Suitable methods for performing the metallization include, but are not limited to, atomic layer deposition, thermal evaporation, RF plasma sputtering, wafer-bonding and electron-beam deposition.

After making any desired electrical contacts, the device resulting from the method of FIG. 5 can be hermetically sealed to prevent air degradation of the active polymer. Suitable materials for sealing the device include airtight polymers such as poly(dicyclopentadiene) or poly(vinyl alcohol co-ethylene).

In one example of the method disclosed in FIG. 5, the first electrode 12 includes a layer of fluorine tin oxide (FTO) on a layer of $SiO_2$ substrate as shown in FIG. 2 and a precursor for the first anchoring groups 16 is represented by $CH_2CHCH_2PO(OH)_2$. Using the Tethering by Aggregate Growth method on these materials produces first anchoring groups 16 that are attached to the first electrode 12 as shown in FIG. 2 and that terminate in a carbon-carbon double bond. The first semiconducting polymer is polymerized on the first anchoring groups 16 using a Surface Initiated Ring-Opening Metathesis Polymerization where Grubb's catalyst is the catalyst and the monomer is [18]annulene-1,4; 7,10; 13,16-trisulfide. The result of this polymerization is the poly(thienylenevinylene) illustrated in FIG. 2. After the polymerization is paused, a layer of nanoparticles 36 is deposited on the poly(thienylenevinylene) chains by transfer printing. The nanoparticles 36 are silver nanoparticles 36 with a diameter of 50-100 nm. The Surface Initiated Ring-Opening Metathesis Polymerization is resumed using the same catalyst and cycloctatetraene as the second monomer. The result of the resumed polymerization is the polyacetylene illustrated in FIG. 2. The polymerization is stopped with the diphosphonic acid represented by $(OH)_2OP(CH_2)_xCH=CH(CH_2)_xPO(OH)_2$ so as to double bond a terminal carbon in the polyacetylene to the second anchoring group 20 precursor represented by $=CH(CH_2)_xPO(OH)_2$. The result is metallized with aluminum using thermal evaporation so as to covalently bond the second anchoring groups 20 to the second electrode 14 as shown in FIG. 2.

The Surface Initiated Ring-Opening Metathesis Polymerization and the Ring-Opening Metathesis Polymerization discussed above are living polymerizations and/or can be performed under the conditions that make the polymerization a living polymerization. As a result, the rate at which the different polymer chains grow is more consistent than seen in traditional chain polymerization. The similarity in the rate at which each chain grows results in chains of very similar lengths. For instance, more than 50%, 75%, or 90% of the active polymer chains 24 can have a distance between the terminal carbons at opposing ends of each polymer chains 24 is equal to the average distance between the terminal carbons +/−50 nm, 25 nm or 10 nm of that average distance.

The above techniques can align the chains as discussed above. For instance, in the method discussed above, the polymer chains can be grown on a self-assembled monolayer of first anchoring groups 16. The use of self-assembled monolayers allows the first anchoring groups 16 to be densely packed on the first electrode 12. Growing the polymer chains on densely packed first anchoring groups 16 keeps the polymer chains densely packed. Additionally, the consistency in the rate at which each chain grows effectively causes the polymer chains to be formed one layer at a time. The combination of the dense packing and forming the polymer chains in layers causes the pattern in which the first anchoring groups 16 are arranged on the first electrode 12 to be retained through the polymer chains as discussed above.

While Ring-Opening Metathesis Polymerizations can be performed in liquid phases or in vapor phases, performing the vapor phase may provide even further alignment of the polymer chains. For instance, the rate of diffusion of the catalyst in solution is higher than at a vapor/solid interface. The reduced rate of diffusion in the vapor phase growth reduces the opportunity for the polymer chains to change directions during growth. As a result, performing the ring-opening metathesis polymerizations in a vapor phase can further enhance of the alignment of the polymer chains. Performing the polymerization in the vapor phase includes exposing the device to monomers and catalysts in the vapor phase.

When using the above methodology, there may be no need for the polymers or monomers to include solubilizing side chains because the polymers are grown directly on the electrode surface and no further processing is necessary. As a result, in some instances, the monomers and/or resulting polymers can be unsubstituted and/or exclude sidechains.

The above discussion applies the nanoparticles 36 on the polymer chains after stopping the growth of the first semiconducting polymer and starting the growth of the second semiconducting polymer. As discussed above, a p-n junction is formed at the interface of the first semiconducting polymer and the second semiconducting polymer. As a result, the p-n junction can be located in the interstices between adjacent nanoparticles 36. An entity is positioned in an interstice between nanoparticles 36 when a line that contacts two of the nanoparticles 36 also passes through that entity. The two nanoparticles 36 contacted by the line are preferably adjacent to one another. The method can be modified to move the layer of the nanoparticles 36 to other locations in the active layer 10. For instance, the growth of the first semiconducting polymer can be paused, the nanoparticles 36 can be applied and the growth of the first semiconducting polymer resumed in order to move the layer of nanoparticles 36 away from the p-n junction and into the first semiconducting polymer. As a result, the layer of nanoparticles 36 would be located between the first electrode 12 and the p-n junction. In some instances, the layer of nanoparticles 36 would be located between the first electrode 12 and the p-n junctions without the p-n junctions being located in the interstices of the nanoparticles 36. Additionally or alternately, the growth of the second semiconducting polymer can be paused, the nanoparticles 36 can be applied and the growth of the second semiconducting polymer resumed in order to move the layer of nanoparticles 36 away from the p-n junction and into the second semiconducting polymer. As a result, the layer of nanoparticles 36 would be located between the second electrode 14 and the p-n junction. In some instances, the layer of nanoparticles 36 would be located between the second electrode 14 and the p-n junctions without the p-n junctions being located in the interstices of the nanoparticles 36. Using these techniques, multiple layers of nanoparticles 36 can be present in the active layer 10. Accordingly, the active layer 10 can include one or more layers of nanoparticles 36. Different layers of nanoparticles 36 can include different nanoparticles 36.

The ability to pause and restart the polymerization also permits the formation of multiple junctions in the active layer 10. For instance, an active polymer 24 for use in the active layer 10 can be formed using the above methods to polymerize an organic polymer that serves as an electron donor, followed by polymerizing an organic polymer that serves as an electron acceptor, followed by polymerizing an organic polymer that serves as an electron donor. The result is a device having two p-n junctions. The steps can be repeated to form more than two junctions within the active layer 10. An organic polymer that serves as an electron donor in one block of the active polymer 24 can be the same or different from the organic polymer that serves as an electron donor in another block of the active polymer 24 and/or an organic polymer that serves as a electron acceptor in one block of the active polymer 24 can be the same or different from the organic polymer that serves as a electron acceptor in another block of the active polymer 24. As noted above, the active layer 10 can optionally include one or more layers of nanoparticles 36 at different locations along the length of the active polymer 24.

A suitable thickness for a layer of nanoparticles 36 includes a thickness greater than 5 nm, 50 nm, or 100 nm and/or less than 2 µm, 250 nm, or 100 nm. A suitable average distance from the first electrode 12 or the second electrode 14 to the last carbon in the chain of the active polymer 24 includes distances greater than 10 nm, 50 nm, or 500 nm and/or less than 1 cm, 1 mm, or 1 µm. Accordingly, the thickness of the layer of nanoparticles 36 can be less than 75%, 50%, 25% of an average distance between the electrode and a carbon located at the terminal end of each active polymer 24 chains. In some instances, the first semiconducting polymer has more than 5, 50, or 500 repeating units and/or less than 500,000, 50,000, or 5000 repeating units and/or the second semiconducting polymer has more than 5, 50, or 500 repeating units and/or less than 500,000, 50,000, or 5000 repeating units.

Although the method of FIG. 5 discusses the formation of nanoparticles 36 in the active layer 10, these nanoparticles 36 are optional as discussed above. The above method can be modified to form devices without these nanoparticles 36 (i.e. FIG. 1) by forgoing the steps where the nanoparticles are positioned in the active layer 10.

Although the method of FIG. 5 discusses the active polymer 24 being formed from the first electrode 12 toward the second electrode 14, the disclosed method can be performed in reverse. For instance, the method can start with the second electrode 14 and work toward attachment of the first electrode 12 at the end of the method. As a result, terms like first and second do not denote sequence but are employed to distinguish between different features.

Example 1

2×2 cm silicon coupons were cleaned with piranha for one hour, rinsed with DI water, methanol and acetone, and dried under argon. A self assemble monolayer of pent-5-enyl phosphonic acid was prepared on a surface of the coupons by the TBAG method from a solution in THF. In a nitrogen-filled glove box, the functionalized coupon was placed into a solution of 25 mg of the Ru catalyst [1,3-Bis(2,4,6-trimethylphenyl)-2-imidazolidinylidene]dichloro(3-methyl-2-butenylidene) (tricyclohexylphosphine)ruthenium(II) in 2 mL of toluene, which was held under static vacuum for 10 minutes. The coupon was removed and submerged into fresh toluene, rinsed with ~10 mL of toluene, and allowed to dry. The coupon was placed in a flat-bottomed Schlenk flask, which was evacuated to 150 millitorr and backfilled with 5 psi acetylene gas for 16 hours. Dark black crystallites were observed by optical microscopy. These crystallites can be contacted with a metal probe tip to provide an example of a complete device, where the silicon substrate serves as one electrode, and the probe tip as the other.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An electronics device, comprising:
   a first electrode and a second electrode;
   organic polymer chains that are each covalently linked to both the first electrode and the second electrode; and
   a layer of nanoparticles arranged such that at least a portion of the organic polymer chains extend through interstices between the nanoparticles.

2. The device of claim 1, wherein terminal ends of each organic polymer chain are covalently linked to both the first electrode and the second electrode.

3. The device of claim 1, wherein a first portion of each organic polymer chain is a polymer that is an electron acceptor and a second portion of each organic polymer chain is polymer that is an electron donor.

4. The device of claim 1, wherein the organic polymer chains are aligned with one another.

5. The device of claim 1, wherein the organic polymer chains each includes a p-n junction and at least a portion the p-n junctions are positioned in interstices between the nanoparticles.

6. The device of claim 5, wherein a thickness of the layer of nanoparticles is less than 50% of an average distance between a carbon at a first terminal end of each organic polymer chain and a carbon located at a terminal end of each organic polymer chain.

7. An electronics device, comprising:
   block copolymer chains that are aligned with one another and that are positioned on a surface of an electrode;
      the block copolymer chains each including a first block of a first organic polymer; and
      the block copolymer chains each including a second block of a second organic polymer;
   a layer of nanoparticles arranged such that the block copolymer extends through interstices between the nanoparticles.

8. The device of claim 7, wherein the first organic polymer is a semiconducting organic polymer that acts as an electron acceptor and the second organic polymer is a semiconducting organic polymer that acts as an electron donor.

9. The device of claim 7, wherein the electrode is transparent to sunlight.

10. The device of claim 7, wherein a p-n junction is formed at an interface between the first block and the second block.

* * * * *